United States Patent
Rosenkranz et al.

(10) Patent No.: US 9,398,380 B2
(45) Date of Patent: Jul. 19, 2016

(54) METHOD FOR CONTROLLING AN ADAPTATION INCREMENT AND HEARING APPARATUS

(71) Applicant: SIVANOTS PTE. LTD., Singapore (SG)

(72) Inventors: Tobias Daniel Rosenkranz, Erlangen (DE); Tobias Wurzbacher, Fuerth (DE)

(73) Assignee: Sivantos Pte. Ltd., Singapore (SG)

( * ) Notice: Subject to any disclaimer, the term of this patent is extended or adjusted under 35 U.S.C. 154(b) by 65 days.

(21) Appl. No.: 14/260,474

(22) Filed: Apr. 24, 2014

(65) Prior Publication Data

US 2014/0321683 A1  Oct. 30, 2014

(30) Foreign Application Priority Data

Apr. 24, 2013  (DE) .......................... 10 2013 207 403

(51) Int. Cl.
*H04R 25/00* (2006.01)
*H04R 3/02* (2006.01)
*H04R 1/10* (2006.01)

(52) U.S. Cl.
CPC ............ *H04R 25/453* (2013.01); *H04R 1/1091* (2013.01); *H04R 3/02* (2013.01)

(58) Field of Classification Search
CPC ................................ H04R 25/453; H04R 3/02
USPC .................................................. 381/316–318
See application file for complete search history.

(56) References Cited

U.S. PATENT DOCUMENTS

| 2003/0053647 | A1* | 3/2003 | Kates ............................ 381/318 |
| 2009/0067651 | A1* | 3/2009 | Klinkby et al. ............... 381/313 |
| 2011/0249845 | A1* | 10/2011 | Kates ............................ 381/317 |

OTHER PUBLICATIONS

Toon Van Waterschoot et al: "Fifty Years of Acoustic Feedback Control: State of the Art and Future Challenges",Proceedings of the IEEE, vol. 99, No. 2, Feb. 2011, pp. 288-327.
Haykin S., "Adaptive Filter Theory", Englewood Cliffs, NJ: Prentice Hall, Chapter 6, "Normalized Least-Mean-Square Adaptive Filters", pp. 320-324; 1999; CA.

* cited by examiner

*Primary Examiner* — Ahmad F Matar
*Assistant Examiner* — Katherine Faley
(74) *Attorney, Agent, or Firm* — Laurence A. Greenberg; Werner H. Stemer; Ralph E. Locher

(57) ABSTRACT

Feedback whistling and external tonal signals are distinguished during feedback suppression. For that purpose an adaptation increment of an adaptive filter of a hearing apparatus for feedback reduction is controlled. A sound signal is picked up by a microphone and a microphone signal is output, from which an earpiece signal for an earpiece is generated. An adaptive filter reduces a feedback signal in the microphone signal. To this end an autocorrelation value of sampled values of the microphone signal, between which a time difference exists, is obtained, and the adaptation increment of the adaptive filter is controlled based on the autocorrelation value. A frequency of an output signal obtained on the basis of the microphone signal is shifted while creating the earpiece signal and the time difference for obtaining the autocorrelation value is controlled as a function of the shifting of the frequency of the microphone signal.

10 Claims, 3 Drawing Sheets

METHOD FOR CONTROLLING AN ADAPTATION INCREMENT AND HEARING APPARATUS

CROSS-REFERENCE TO RELATED APPLICATION

This application claims the priority, under 35 U.S.C. §119, of German patent application DE 10 2013 207 403.4, filed Apr. 24, 2013; the prior application is herewith incorporated by reference in its entirety.

BACKGROUND OF THE INVENTION

Field of the Invention

The present invention relates to a method for controlling an adaptation increment of an adaptive filter of a hearing apparatus for feedback reduction. In this method a sound signal is picked up by a microphone of the hearing apparatus and a corresponding microphone signal is output. On the basis of the microphone signal a hearing signal is created for an earpiece and a feedback signal in the microphone signal is reduced by an adaptive filter. In addition the present invention also relates to a corresponding hearing apparatus. A hearing apparatus is to be understood here as any device able to be worn in or on the ear producing an acoustic stimulus, especially a hearing aid, a headset, earphones and the like.

Hearing aids are wearable hearing devices serving to aid persons with impaired hearing. In order to meet the numerous individual requirements, different forms of hearing aid such as behind-the-ear (BTE) hearing aids, hearing aids with external earpieces (RIC: receiver in the canal) and in-the-ear hearing aids, e.g. also Concha hearing aids or in-canal hearing aids, are provided. The hearing aids given by way of example are worn on the outer ear or in the auditory canal. In addition there are also bone-conduction hearing aids, implantable or vibrotactile hearing aids available on the market. In such cases the damaged hearing is stimulated either mechanically or electrically.

In principle, hearing aids possess an input transducer, an amplifier and an output transducer as their major components. The input transducer is generally a sound receiver, e.g. a microphone and/or an electromagnetic receiver, e.g. an induction coil. The output transducer is mainly implemented as an electro-acoustic converter, e.g. miniature loudspeaker or as an electro-mechanical converter, e.g. bone conduction earpiece. The amplifier is usually integrated into a signal processing unit. This basic structure is shown in FIG. 1, using a behind-the-ear hearing aid as an example. One or more microphones 2 for receiving the sound from the environment are usually built into a hearing aid housing 1 for wearing behind the ear. A signal processing unit (SPU) 3, which is likewise integrated into the hearing aid housing 1, processes the microphone signals and amplifies them. The output signal of the signal processing unit 3 is transmitted to a loudspeaker or earpiece 4, which outputs an acoustic signal. The sound is transmitted to the eardrum of the hearing aid wearer if necessary via a sound tube which is fixed to an otoplastic in the auditory canal. Energy is supplied to the hearing aid and especially to the signal processing unit 3 by a battery (BAT) 5 likewise integrated into the hearing aid housing 1.

Audio systems or hearing apparatuses, such as those concerned here, possess at least one microphone for picking up sound in their environment, a downstream signal processing unit for processing the microphone signal (e.g. amplification) and a loudspeaker or earpiece to which the processed microphone signal is sent and which emits a corresponding sound signal to the environment. A particular problem with these types of hearing apparatus lies in the fact that acoustic feedback occurs, which needs to be eliminated. Feedback to hearing apparatus generally takes the form of irritating feedback whistling.

An acoustic feedback occurs when the sound emitted by the earpiece enters the hearing apparatus through the microphone again and is amplified. In such cases the closed loop of: Microphone—amplification—earpiece—microphone—etc. is produced. Feedback whistling results when the amplification lies above a certain threshold value.

The undesired whistling can be reduced or even eliminated by a feedback reduction unit. Adaptive feedback reduction methods have long been known, in which an adaptive filter models the time-variant pulse response g of the acoustic feedback path. A general example for an adaptation rule for the updating of the filter coefficient h is the algorithm of the normalized least mean square (NLMS):

$$h(k+1) = h(k) + \mu[(e\#(k))x(k))/(x\#(k)x(k))].$$

In this equation k represents the discrete time index, x is the input signal for the feedback reduction unit, $e = m - c$ is the error signal defined as the difference between the microphone signal m and the feedback compensation signal c, $\mu$ is the increment parameter controlling the adaptation speed and # is the conjugated complex operation. The variables used here are in general complex values and especially represent frequency range values.

FIG. 2 illustrates a block diagram of a prior art technique for feedback reduction in a hearing device. A microphone 2 picks up a sound signal and from said signal generates a corresponding microphone signal m. This microphone signal m is fed to the signal processing device 3. The output signal x of the signal processing device 3 is fed to an earpiece 4. This produces an output signal s which is intended for the ear of a hearing device wearer or of a user of the hearing apparatus. A part of the output sound signal s is fed back as a feedback signal r to the input of the hearing device or the hearing apparatus. The feedback path possesses the transmission function g. On the input side a useful signal n is added to the feedback signal r and the sum signal n+r forms the input sound signal for the microphone 2.

In the signal processing device 3 a compensation signal c is subtracted from the microphone signal m by means of an adder 6, in that a negative signal −c is added to the microphone signal m. The result is the error signal e, which is fed to a central signal processor 7 (CSP) which produces the output signal x. The output signal x is fed to a feedback compensator 8 (FBC). The unit FBC possesses the transmission function h, which is used as an estimated variable for the transmission function g of the feedback path. The output signal of the feedback compensator 8 is the compensation signal c which is thus represented as: c=h*x, wherein * describes the convolution operation. The feedback compensator 8 is also controlled with the error signal e. Overall the feedback signal r is thus compensated for by the compensation signal c, so that irritating feedback whistling is eliminated.

Details about the functioning and the construction of such hearing apparatuses with feedback suppression or feedback reduction are described in the book by S. Haykin: "Adaptive Filter Theory", Englewood Cliffs, N.J.: Prentice Hall, 1999, Chapter 6 "Normalized Least-Mean-Square Adaptive Filters," pages 320-324. In addition the reader is referred to an article by Toon van Waterschoot and Marc Moonen, "Fifty years of acoustic feedback control: state of the art and future challenges," Proc. IEEE, vol. 99, no. 2, February 2011, Pages 288-327.

The feedback compensator 8 is typically realized as an adaptive filter. The adaptation speed of the filter is able to be controlled with a parameter μ, which is also referred to as the increment. A suitable time-dependent control of the increment μ is required for an effective and stable feedback compensation behavior. If the increment μ is large, the filter adapts quickly to new situations of the acoustic feedback path g, whereby feedback whistling is prevented. On the other hand a large increment μ leads to marked misadaptations, which give rise to unpleasant artifacts when the input signal is correlated, i.e. the autocorrelation function differs from zero. This is especially the case with tonal input signals.

If, on the other hand, the increment μ is small, these artifacts can essentially be prevented or reduced. However the price for this is a very restricted capability for reacting to changes of the feedback path.

SUMMARY OF THE INVENTION

It is accordingly an object of the invention to provide a method of controlling an adaptation speed of an adaptive filter of a hearing apparatus which overcomes the above-mentioned and other disadvantages of the heretofore-known devices and methods of this general type and which provides for an improved sound quality of the output sound in a hearing apparatus when the feedback path changes. It is a further object to provide a corresponding device, such as a hearing apparatus, with the improved feedback compensation.

With the foregoing and other objects in view there is provided, in accordance with the invention, a method of controlling an adaptation increment of an adaptive filter of a hearing apparatus for feedback reduction, the method comprising:

picking up a sound signal by a microphone of the hearing apparatus and outputting a corresponding microphone signal;

generating an earpiece signal for an earpiece of the hearing apparatus based on the microphone signal; and reducing a feedback signal in the microphone signal with the adaptive filter and thereby:

obtaining an autocorrelation value from sampled values of the microphone signal between which a time difference exists;

controlling an adaptation increment of the adaptive filter based on the autocorrelation value;

shifting a frequency of an output signal obtained on the basis of the microphone signal in the step of generating the earpiece signal; and controlling a time difference for obtaining the autocorrelation value as a function of the shifting of the frequency of the output signal.

In other words, the objects of the invention are achieved by a method for controlling an adaptation increment of an adaptive filter of the hearing apparatus for a feedback reduction by picking up of a sound signal with a microphone of the hearing apparatus and output of a corresponding microphone signal, creation of an earpiece signal for an earpiece of the hearing apparatus based on the microphone signal, and reduction of the feedback signal in the microphone signal by the adaptive filter; obtaining an autocorrelation value from sampled values of the microphone signal between which a time difference exists, controlling the adaptation increment of the adaptive filter on the basis of the autocorrelation value, shifting a frequency of an output signal obtained on the basis of the microphone signal during the creation of the earpiece signal, and controlling the time difference for obtaining the autocorrelation value as a function of the shifting of the frequency of the output signal.

With the above and other objects in view there is also provided, in accordance with the invention, a hearing apparatus with:

a microphone for picking up a sound signal and outputting a corresponding microphone signal;

an earpiece;

a signal processing device for creating an earpiece signal for the earpiece on the basis of the microphone signal; and an adaptive filter for reducing a feedback signal in the microphone signal.

The hearing apparatus further comprises:

an autocorrelation unit for obtaining an autocorrelation value from sampled values of the microphone signal between which a time difference exists, and a control device for controlling an adaptation increment of the adaptive filter on the basis of the autocorrelation value, wherein a frequency of an output signal obtained on the basis of the microphone signal is able to be shifted by the signal processing device during the creation of the earpiece signal, and in the autocorrelation unit the time difference for obtaining the autocorrelation value is able to be controlled as a function of the shifting of the frequency of the output signal.

Microphone signal and output signal are decorrelated in an advantageous manner by the frequency shift. Feedback-related whistling thus has only a very small tonal character, which is reflected in small autocorrelation values. The increment for the adaptive filter is then controlled as a function of the autocorrelation value. Thus a new control concept for the increment μ is produced which controls the adaptation speed possibly in sub bands in the optimum way, in order, especially with tonal signals, to achieve a good sound quality without artifacts, while in all other situations the possibility is retained of reacting rapidly to changes of the feedback path.

The creation of the earpiece signal, i.e. of the output signal for the earpiece from the microphone signal, by a central signal processing unit for example, can occur with a time delay which is incorporated for controlling the time difference for obtaining the autocorrelation value. Thus the internal signal processing conditions are taken into account for the increment control.

Preferably the time difference for obtaining the autocorrelation value is controlled such that the autocorrelation value for feedback-related whistling lies below a predetermined threshold value. Expediently the threshold value lies below 60% of the maximum autocorrelation value. This allows feedback signals to be more clearly distinguished from tonal signals, which are characterized by higher autocorrelation values.

In addition the control of the time difference for obtaining the autocorrelation value can occur such that the autocorrelation value assumes a minimum in the event of feedback whistling. This enables an especially clear distinction option to be realized between feedback signals.

Furthermore the time difference for obtaining the autocorrelation value can be controlled dynamically with a change of the shift of frequency of the microphone signal. In such cases the variable frequency shift can be either reduced or increased, as the situation dictates. The inventive method is thus especially also able to be used if, to avoid frequency shift artifacts, a frequency shift is temporarily dispensed with.

It is especially advantageous for the method for controlling the adaptation increment to be carried out in a number of parallel frequency sub-bands, each independent of one another. This allows the adaptation of the filter to be realized in the optimum way in all frequency ranges.

Furthermore the adaptation increment, based on a starting value, can only be reduced when the autocorrelation value, after normalization with the standard correlation value which is produced for the time difference of zero, lies in a predetermined range around/close to one. If the autocorrelation value, despite the decor relating effect of the frequency shift, lies close to one, a tonal input signal must be present. In this case it is then of advantage when the adaptation increment is reduced in order to avoid misadaptations.

In accordance with a further embodiment the autocorrelation value is not obtained from sampled values of the microphone signal, but from sampled values of an error signal, which corresponds to the difference between the microphone signal and a correction signal or compensation signal of the adaptive filter. This represents a signaling technology variant for obtaining the autocorrelation value from the sampled values of the microphone signal.

The inventive hearing apparatus can especially be embodied as a hearing device.

Other features which are considered as characteristic for the invention are set forth in the appended claims.

Although the invention is illustrated and described herein as embodied in a method for controlling an adaptation increment and a hearing apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
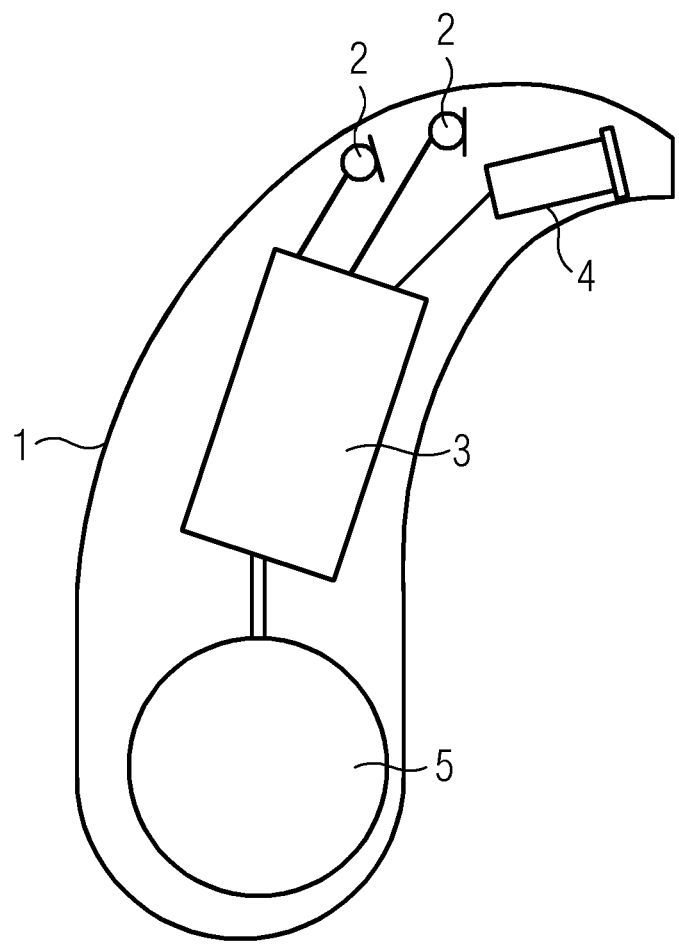
FIG. 1 shows the basic layout of a hearing device in accordance with the prior art.

There basically exist two principles which relate in incremental control to the problem of correlated input signals, namely:

a) The basic increment is kept small in order to avoid misadaptation, whereby the sound quality is kept to a high level. The increment is increased when the feedback whistling is detected so that the filter can adapt rapidly to the situation. In this approach there are two problems: (1) The filter can only be adapted when feedback whistling occurs, but this means that the wearer of the hearing apparatus or of the hearing device perceives the unpleasant feedback whistling until the filter is suitably adapted. (2) Without further aids it is actually impossible to distinguish between feedback whistling and an external tonal sound signal, which is why the increment is often increased for tonal input sound. This mostly leads to misadaptations of the filter and to serious artifacts. A further aid for distinguishing between a feedback sound signal and an external tonal sound signal can be a (non-audible) phase modulation of the earpiece signal. When this modulation is detected in the input signal, this is highly likely to indicate feedback whistling. This method requires a few hundred milliseconds in order to detect the modulation adequately. Feedback whistling lasting for this length of time is unacceptable for the hearing device wearer.

b) The basic increment is kept high so that almost no feedback whistling can occur. The increment will be reduced whenever a tonal sound signal is detected, since tonal sound signals lead to misadaptations. This approach conceals the risk of an adaptation to the feedback that is too slow if feedback whistling occurs despite the large increment, since the increments would be reduced (erroneously) in the event of feedback whistling. To counteract this undesired behavior a reliable and rapid detection of the feedback whistling would be required.

Feedback detectors can be implemented in various ways. In a simple embodiment they look for peaks in the input spectrum. Another method consists of estimating the autocorrelation function (ACF) of the input signal. A high autocorrelation with a time difference other than zero indicates a tonal signal. However the two methods cannot distinguish between external tonal input signals and feedback whistling.

This dilemma is resolved by the inventive approach explained below. This new approach is based for example on a sub-band processing in the frequency range, realized for example by a short-duration Fourier transformation or a polyphase filter bank. The basic increment is kept high so that the filter can adapt very rapidly to changes of the feedback path. With a tonal input signal the increment is reduced. A tonal input signal is indicated by a high autocorrelation value (ACF value) of the input signal. The ACF value of the input signal is estimated here in each sub-band. The ACF value of a (complex) signal x(n) at point in time n is defined for a time difference k as $$ACF(n, k) = E\{x(n)x(n-k)\#\}.$$

In this case $E\{\ \}$ means the expected value operator and $x\#$ means the conjugated complex of x. The symbol x(n) is to be seen here as representative of any given signal and not necessarily to be equated with the earpiece signal x of FIG. 2. Instead, in the present example the signal x(n) will correspond to the microphone signal m.

In practice the expected value will be approximated by the average value over time, which can also be done recursively. In this case this is advantageous to normalize the ACF values by dividing each value by the value for the time difference zero between the sample values. All values are thus to be found in the range of [−1, 1]. A tonal input signal or an input sound signal in a sub band of the total frequency band to be processed can be described sufficiently accurately as a sine wave oscillation in this sub band. In the frequency range this sine wave oscillation corresponds to the complex number $Ae^{(-j\phi)}$, wherein A means the amplitude and $\phi$ the phase. The absolute value of the normalized ACF value of this sine oscillation for any given time difference k always amounts to one, since the amplitude is normalized to one, and the product of two complex exponential values always possesses the absolute value one. Consequently values close to one indicate tonal input signals.

It is advantageous to control the increment of the feedback compensator individually in each individual frequency sub band. The option of reacting rapidly to changes of the feedback path is then available in all sub bands which do not contain any tonal signals.

Figure 3:
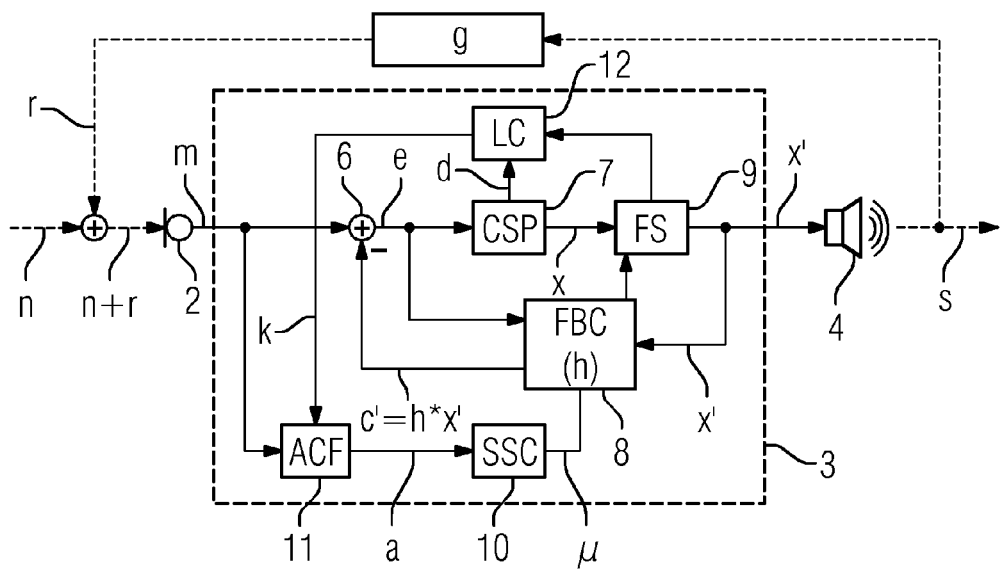
FIG. 3 shows a block diagram of a hearing device with incremental control for the feedback suppression in accordance with the present invention.

An actual structure of a hearing device with inventive incremental control of the adaptive filter for feedback compensation is now explained in FIG. 3 by way of example. This example is also transferable to other hearing apparatuses. The block diagram of FIG. 3 also symbolizes the corresponding inventive method in an actual example.

To distinguish between an external tonal signal and feedback whistling the output signal x of the central signal processing unit 7 is shifted by a certain difference frequency in the frequency range. The frequency shift is advantageous for feedback suppression, since it decorrellates the input signal and the output signal of the hearing apparatus. For this purpose the main signal path between the central signal processing unit 7 and the earpiece 4 is now supplemented by a frequency shift unit 9 (FS). The structure of the hearing apparatus is based in this case on the structure depicted in FIG. 2. The reader is therefore referred to the description given there.

The output signal x of the central signal processing unit 7 is thus initially fed to the frequency shift unit 9. The resulting signal x' then represents the earpiece signal for the earpiece 4. This earpiece signal x' is conveyed to the feedback compensator 8, of which the output signal now represents the modified compensation signal c'=h·x'. As in the case of FIG. 2 the compensation signal c' will also be added negatively with the aid of the adder 6 to the microphone signal m, i.e. subtracted from it, in order to obtain the error signal e.

Figure 2:
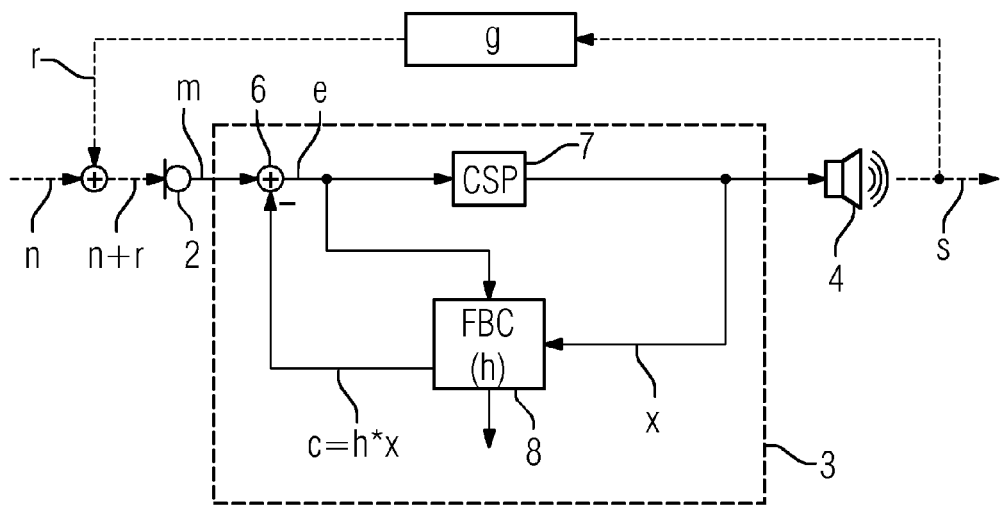
FIG. 2 shows a block diagram of a prior art hearing device with feedback suppression.

The feedback compensator 8, unlike in the example of FIG. 2, does not now possess a fixed increment for the adaptation but a variable increment μ. This variable increment μ will be dynamically adapted by an increment control unit 10 (SSC) of the signal processing device 3. For this purpose the increment control unit 10 receives an autocorrelation value a from an autocorrelation unit 11 (ACF), which is likewise integrated into the signal processing device 3. The autocorrelation value a is formed in accordance with the above formula from the microphone signal m. In particular it is formed from sampled values which are spaced from one another in time by the time difference k. This time difference k is delivered by a time control unit 12 (LC) of the signal processing device 3. The time control unit 12 receives data (especially the shift amount or the differential frequency for the frequency shift) from the frequency shift unit 9. If these variables are known a priori and constant, the time difference k can also be set to a fixed value in an optimum manner. Optionally, for establishing the time difference k for the autocorrelation, a delay value d can also be included by the central signal processing unit 7 for example. This thus means that the time difference for the autocorrelation is defined as a function of the shift frequency. The increment μ is then determined for the adaptive filter of the feedback reduction unit 8 from the autocorrelation value a.

If feedback whistling now occurs, this whistling will be picked up by the microphone again and shifted in frequency. The shifted whistling tone is picked up again and shifted again. A spectrogram pattern always repeating at higher frequencies is thus produced. The frequency shift leads to spectral lines pointing upwards or downwards.

Figure 4:
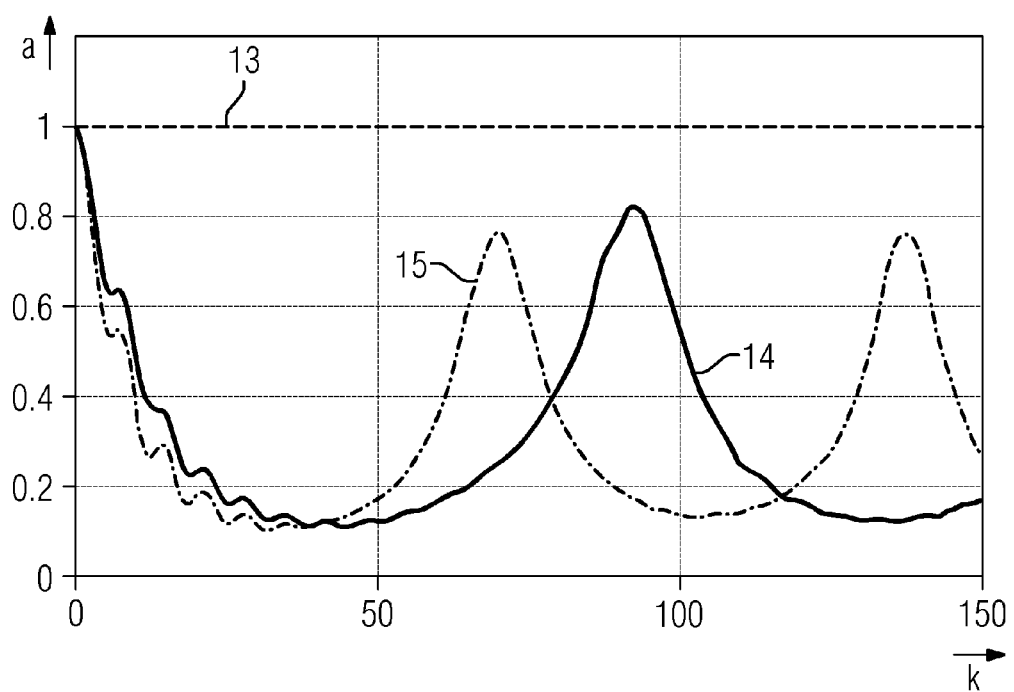
FIG. 4 shows the autocorrelation of the feedback signal in a sub-band via the time difference between two signal sample values.

The amplitude of the autocorrelation value a of such a signal is generally not close to one for the various time differences. It is only a comparatively high (close to one) for certain time differences at periodic intervals, as can be seen in FIG. 4. In this figure the autocorrelation value a is plotted for feedback against the time difference k. For a pure sine wave tone—which would also occur through feedback whistling without frequency shifting—as a microphone signal m, the constant autocorrelation value a=1 is produced in accordance with the straight line 13. If the output signal x is now shifted by the frequency f1, the autocorrelation value a follows the curve 14. With a frequency shift f2 the curve 15 is produced, wherein f1<f2.

The period time of each curve 14, 15 is determined by the delay which is produced by the signal processing, but also by the feedback path and the shift frequency. The increment is now only reduced if the amplitude of the autocorrelation value a lies close to one, which is the case for specific time differences k. In order to decide whether the autocorrelation value lies "close to one", a threshold value can be included. For example this decision has a positive outcome if the autocorrelation value a lies above 0.6 or 60% respectively. The time difference k is thus selected as a function of the shift frequency and the processing delay so that the feedback coupling for the respective time difference k does not deliver any autocorrelation values a close to one. Preferably time differences k are thus selected for which the autocorrelation value is very small and especially assumes a minimum. This means that the control method is no longer sensitive to feedback whistling and the high adaptation rate (large increment) is retained, even if feedback whistling should occur.

In the above exemplary embodiment in accordance with FIG. 3 the autocorrelation value a is calculated from the microphone signal m. In an alternate embodiment the autocorrelation value a is calculated from the error signal e.

In an advantageous manner the method operates in accordance with the above exemplary embodiments far more quickly than known methods which are based on modulation detection. The inventive method is also capable of reacting very rapidly (in only a few milliseconds). Depending on the configuration, response times of below 10 ms can be achieved in this way.

Simple feedback detectors, such as are used for detection of tonal signals, which only look for spectral peaks, would not be capable of distinguishing between external tonal signals and feedback whistling, since the spectrogram pattern of the feedback whistling described above typically has a narrow bandwidth and therefore, because of the limited resolution of filter banks, is usually not able to be distinguished by pure peak value searches.

In the above exemplary embodiment, in a feedback compensator which operates in one frequency range, and AFC-regulated incremental control together with a frequency shift which makes it possible to distinguish between feedback whistling and external tonal signals, is thus employed. In addition the processing delay and the frequency shift are included for defining the autocorrelation value for a suitable time difference k.

The invention makes it possible to use a feedback compensator in a mode with very high feedback suppression power, wherein there can be very rapid reaction to changes of the feedback path. With correct identification of external tonal signals the adaptation speed can be reduced in those time frequency ranges which contain the external tonal signal components. This allows the misadaptation of the feedback suppression filter to be prevented, which leads to a marked improvement of the sound quality compared to a feedback compensator which is constantly operated with high adaptation speed. The inventive approach is also insensitive to feedback whistling. The reason for this is that the increment is not reduced in the event of feedback whistling, which leads to a markedly better suppression performance compared to feedback compensators which operate in a slow mode. It is also extremely advantageous for the inventive incremental control to be undertaken independently in the subfrequency bands, in order to retain the feedback suppression power in time frequency ranges containing no tonal signals.

The invention claimed is:

1. A method of controlling an adaptation increment of an adaptive filter of a hearing apparatus for feedback reduction, the method comprising:

picking up a sound signal by a microphone of the hearing apparatus and outputting a corresponding microphone signal;

feeding the microphone signal to a signal processing device and generating with the signal processing device an earpiece signal for an earpiece of the hearing apparatus based on the microphone signal; and feeding the earpiece signal to an adaptive filter and subtracting an output signal of the adaptive filter from the microphone signal for reducing a feedback signal in the microphone signal;

feeding the microphone signal, after subtracting the output signal of the adaptive filter, to a central signal processing unit and producing an output signal;

obtaining an autocorrelation value from sampled values of the microphone signal between which a time difference exists;

controlling an adaptation increment of the adaptive filter based on the autocorrelation value;

shifting a frequency of the output signal to thereby obtain the earpiece signal; and controlling the time difference for obtaining the autocorrelation value as a function of the shifting of the frequency of the output signal.

2. The method according to claim 1, wherein the generating step comprises creating the earpiece signal from the microphone signal with a delay used for controlling the time difference for obtaining the autocorrelation value.

3. The method according to claim 1, which comprises adjusting the time difference for obtaining the autocorrelation value such that, in the case of feedback whistling, the autocorrelation value lies below a predetermined threshold value.

4. The method according to claim 1, which comprises adjusting the time difference for obtaining the autocorrelation value such that, in the case of feedback whistling, the autocorrelation value assumes a minimum.

5. The method according to claim 1, which comprises adjusting the time difference for obtaining the autocorrelation value dynamically with a change of the shifting of the frequency of the output signal.

6. The method according to claim 1, which comprises performing the method in parallel in a plurality of frequency sub-bands, with the method steps being performed in each sub-band independent of another sub-band.

7. The method according to claim 1, which comprises reducing the adaptation increment, starting from an initial value, only when the autocorrelation value after a normalization with a standard correlation value that is produced for the time difference of zero, lies in a predetermined range around one.

8. The method according to claim 1, which comprises obtaining the autocorrelation value from sampled values of an error signal corresponding to a difference between the microphone signal and a correction signal of the adaptive filter.

9. A hearing apparatus, comprising:

a microphone for picking up a sound signal and outputting a corresponding microphone signal;

an earpiece;

a signal processing device connected between said microphone and said earpiece for generating an earpiece signal for said earpiece based on the microphone signal;

an autocorrelation unit for obtaining an autocorrelation value from sampled values of the microphone signal, between which a time difference exists;

a central signal processing unit for producing an output signal;

a frequency shift unit disposed to receive the output signal and configured for shifting a frequency of the output signal to obtain the earpiece signal;

an adaptive filter for receiving the earpiece signal and outputting an output signal, wherein the output signal of said adaptive filter is subtracted from the microphone signal for reducing a feedback signal in the microphone signal;

a control device for controlling an adaptation increment of said adaptive filter based on the autocorrelation value;

wherein the time difference for obtaining the autocorrelation value in said autocorrelation unit is controlled as a function of the shifting of the frequency of the output signal.

10. The hearing apparatus according to claim 9, configured as a hearing device.

* * * * *